United States Patent
Lee et al.

(10) Patent No.: US 9,988,472 B2
(45) Date of Patent: Jun. 5, 2018

(54) COMPOSITION, ELECTRONIC DEVICE, AND THIN FILM TRANSISTOR

(71) Applicant: Samsung Electronics Co., Ltd., Suwon-si, Gyeonggi-do (KR)

(72) Inventors: Eun Kyung Lee, Seoul (KR); Jiyoung Jung, Seoul (KR); Jeong Il Park, Seongnam-si (KR); Ajeong Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/239,424

(22) Filed: Aug. 17, 2016

(65) Prior Publication Data

US 2017/0058061 A1   Mar. 2, 2017

(30) Foreign Application Priority Data

Aug. 31, 2015  (KR) ........................ 10-2015-0122983

(51) Int. Cl.
| | |
|---|---|
| *C08F 130/08* | (2006.01) |
| *C09D 183/10* | (2006.01) |
| *H01B 3/46* | (2006.01) |
| *H01L 51/05* | (2006.01) |
| *H01G 4/14* | (2006.01) |
| *C08G 83/00* | (2006.01) |
| *C08G 77/14* | (2006.01) |
| *C08G 77/20* | (2006.01) |
| *C08G 77/442* | (2006.01) |
| *H01L 51/00* | (2006.01) |

(52) U.S. Cl.
CPC .......... *C08F 130/08* (2013.01); *C08G 83/001* (2013.01); *C09D 183/10* (2013.01); *H01B 3/46* (2013.01); *H01G 4/14* (2013.01); *H01L 51/0537* (2013.01); *C08G 77/14* (2013.01); *C08G 77/20* (2013.01); *C08G 77/442* (2013.01); *H01L 51/004* (2013.01); *H01L 51/0074* (2013.01); *H01L 51/0094* (2013.01)

(58) Field of Classification Search
CPC .............................. C08K 5/5425; C08G 77/20
See application file for complete search history.

(56) References Cited

U.S. PATENT DOCUMENTS

| | | | |
|---|---|---|---|
| 8,017,245 | B2 | 9/2011 | Lee et al. |
| 8,043,701 | B2 | 10/2011 | Edelmann et al. |
| 8,124,964 | B2 | 2/2012 | Takimiya et al. |
| 8,138,355 | B2 | 3/2012 | Watanabe |
| 8,153,267 | B2 | 4/2012 | Jeong et al. |
| 8,222,690 | B2 | 7/2012 | Ohtani et al. |
| 8,232,546 | B2 | 7/2012 | Takimiya et al. |
| 8,314,460 | B2 | 11/2012 | Ohtani et al. |
| 8,492,496 | B2 | 7/2013 | Kumar et al. |
| 9,431,619 | B2 | 8/2016 | Lee et al. |
| 2002/0098243 | A1 | 7/2002 | Edelmann et al. |
| 2005/0259212 | A1 | 11/2005 | Lee et al. |
| 2006/0063002 | A1 | 3/2006 | Edelmann et al. |
| 2006/0147715 | A1 | 7/2006 | Lee et al. |
| 2007/0045700 | A1 | 3/2007 | Ohtani et al. |
| 2007/0049659 | A1 | 3/2007 | Quay |
| 2007/0085113 | A1 | 4/2007 | Wu et al. |
| 2007/0145357 | A1 | 6/2007 | Wu et al. |
| 2007/0266896 | A1 | 11/2007 | Suwa et al. |

(Continued)

FOREIGN PATENT DOCUMENTS

| | | |
|---|---|---|
| EP | 1760126 A1 | 3/2007 |
| JP | 2002-265870 A | 9/2002 |

(Continued)

OTHER PUBLICATIONS

JP 2013 234301 machine translation (2013).*
Extended European Search Report dated Jan. 9, 2017 issued in corresponding European Patent Application No. 16184792.6.
Extended European Search Report dated Mar. 8, 2016 issued in corresponding European Patent Application No. 15197322.9.
Irini D. Sideridou, et al. "Effect of the Structure of Silane-Coupling Agent on Dynamic Mechanical Properties of Dental Resin-Nanocomposites," Journal of Applied Polymer Science vol. 110(1), 507-516 (2008).
H.-J. Gläsal, Radiation-cured polymeric nanocomposites of enhanced surface-mechanical properties, 2003, 303-308 pages, Elsevier B.V.

(Continued)

*Primary Examiner* — Kuo Liang Peng
(74) *Attorney, Agent, or Firm* — Harness, Dickey & Pierce, P.L.C.

(57) ABSTRACT

A composition includes a product of a condensation reaction between a thermal cross-linking agent and a product of hydrolysis and condensation polymerization of a compound represented by Chemical Formula 1:

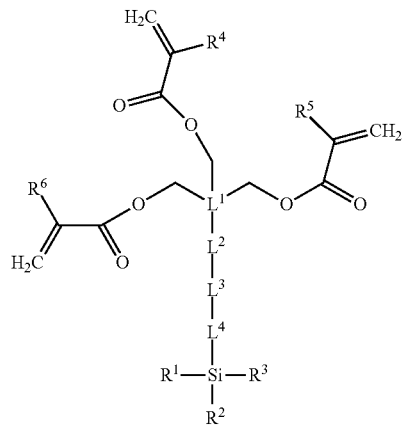

Chemical Formula 1

In Chemical Formula 1, the definitions of the substituents are the same as in the detailed description. Further, an electronic device and a thin film transistor include a cured material of the composition.

21 Claims, 8 Drawing Sheets

(56) References Cited

U.S. PATENT DOCUMENTS

| | | |
|---|---|---|
| 2008/0166493 A1 | 7/2008 | Xiao et al. |
| 2010/0323570 A1 | 12/2010 | Kumar et al. |
| 2011/0001190 A1 | 1/2011 | Ide et al. |
| 2011/0068417 A1 | 3/2011 | Murase et al. |
| 2011/0086946 A1 | 4/2011 | Kotake et al. |
| 2012/0132346 A1 | 5/2012 | Chen et al. |
| 2012/0277339 A1 | 11/2012 | Bajjuri et al. |
| 2013/0320316 A1 | 12/2013 | Park et al. |
| 2015/0011699 A1 | 1/2015 | Shukla et al. |
| 2015/0090979 A1 | 4/2015 | Lee et al. |
| 2015/0168837 A1 | 6/2015 | Loccufier et al. |
| 2015/0203707 A1 | 7/2015 | Klun et al. |
| 2015/0203708 A1 | 7/2015 | Klun et al. |
| 2015/0218294 A1 | 8/2015 | Klun et al. |
| 2015/0221797 A1 | 8/2015 | Klun et al. |
| 2016/0013425 A1 | 1/2016 | Takeya et al. |

FOREIGN PATENT DOCUMENTS

| | | | |
|---|---|---|---|
| JP | 2006-199752 A | | 8/2006 |
| JP | 2007122029 A | | 5/2007 |
| JP | 2007-277332 A | | 10/2007 |
| JP | 2008-298862 A | | 12/2008 |
| JP | 2009-102628 A | | 5/2009 |
| JP | 2009-267134 A | | 11/2009 |
| JP | 2010-147206 A | | 7/2010 |
| JP | 2011-186069 A | | 9/2011 |
| JP | 2011187558 A | | 9/2011 |
| JP | 2011-246548 A | | 12/2011 |
| JP | 2013 234301 | * | 11/2013 |
| JP | 2013234301 A | | 11/2013 |
| JP | 2013-249395 A | | 12/2013 |
| JP | 2014-037453 A | | 2/2014 |
| JP | 2014-048569 A | | 3/2014 |
| JP | 2014082467 A | | 5/2014 |
| KR | 2005-0036171 A | | 4/2005 |
| KR | 2007-0024375 A | | 3/2007 |
| KR | 2008-0002542 A | | 1/2008 |
| KR | 10-0884357 B1 | | 2/2009 |
| KR | 2010-0026154 A | | 3/2010 |
| KR | 2010-0077798 A | | 7/2010 |
| KR | 2010-0114046 A | | 10/2010 |
| KR | 2010-0126407 A | | 12/2010 |
| KR | 2011-0101073 A | | 9/2011 |
| KR | 2011-0106429 A | | 9/2011 |
| KR | 20140070476 A | | 6/2014 |
| KR | 2015-0035370 A | | 4/2015 |
| WO | WO-2008-026602 A1 | | 3/2008 |
| WO | WO-2009/009790 A1 | | 1/2009 |
| WO | WO-2009/116373 A1 | | 9/2009 |
| WO | WO-2010/044332 A1 | | 4/2010 |
| WO | WO-2013/182328 A1 | | 12/2013 |
| WO | WO-2014/025387 A1 | | 2/2014 |
| WO | WO-2014-136827 A1 | | 9/2014 |

OTHER PUBLICATIONS

Jérôme Douce, Effect of filler size and surface condition of nano-sized silica particles in polysiloxane coatings, May 2004, 114-122 pages, Elsevier B.V.

Ying-Ling Liu, Poly(dimethylsiloxane) Star Polymers Having Nanosized Silica Cores, Macromol. Rapid Commun., Jun. 2004, 1392-1395 pages, Wiley-VCH Verlag GmbH & Co. KGaG, Weinheim.

Anubha Goyal, Metal salt induced synthesis of hybrid metal core-siloxane shell nanoparticles and siloxane nanowires, Chem. Commun., Jan. 2010, 964-966 pages, The Royal Society of Chemistry.

Hwa Sung Lee, Interpenetrating polymer network dielectrics for high-performance organic field-effect transistors, Journal of Materials Chemistry, Mar. 2011, 6968-6974 pages, The Royal Society of Chemistry.

Sunho Jeong, Photopatternable Organosiloxane-Based Inorganic-Organic $SiO_2$—$ZrO_2$ Hybrid Dielectrics for Organic Thin Film Transistors, The Journal of Physical Chemistry Letters, Sep. 2007, 16083-16087 pages, American Chemical Society.

U.S. Office Action dated Jan. 27, 2017 issued in co-pending U.S. Appl. No. 14/919,116.

U.S. Office Action dated Jul. 28, 2017 issued in co-pending U.S. Appl. No. 14/919,116.

Office Action for corresponding U.S. Appl. No. 14/919,116 dated Mar. 9, 2018.

U.S. Appl. No. 14/953,884, filing date Nov. 30, 2015.

U.S. Appl. No. 14/191,116, filing date Oct. 21, 2015.

U.S. Office Action dated Apr. 11, 2018 issued in co-pending U.S. Appl. No. 14/953,884.

* cited by examiner

【FIG. 1】
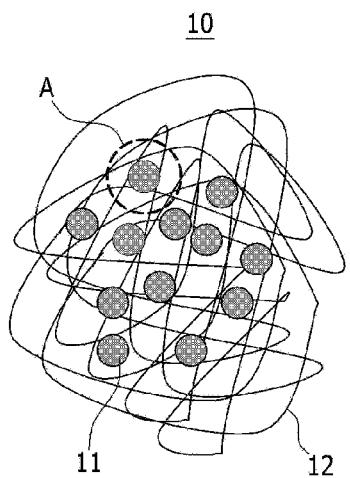
【FIG. 2】
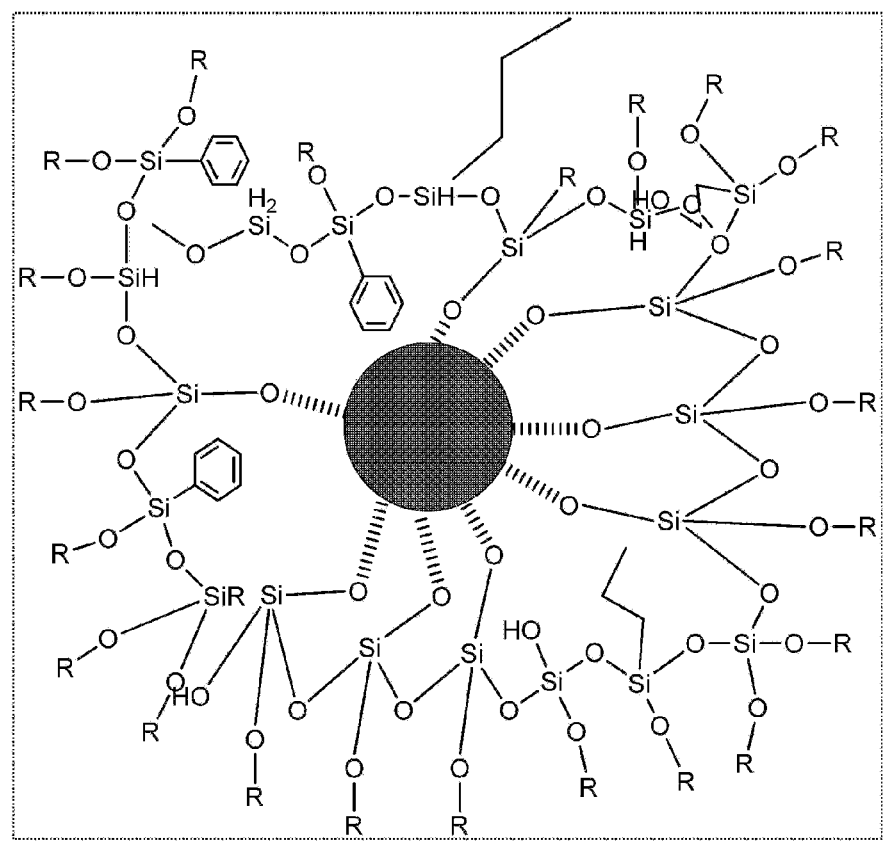

【FIG. 3A】
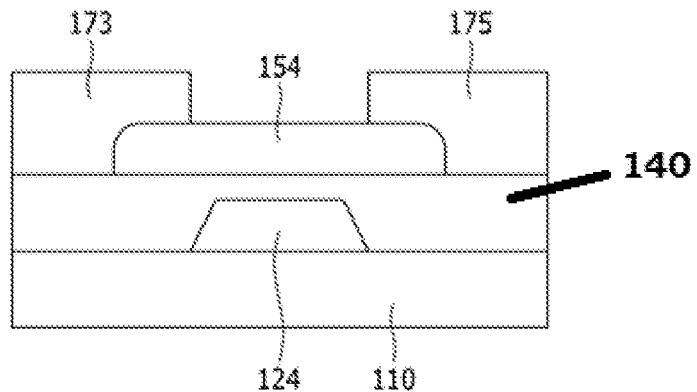
【FIG. 3B】
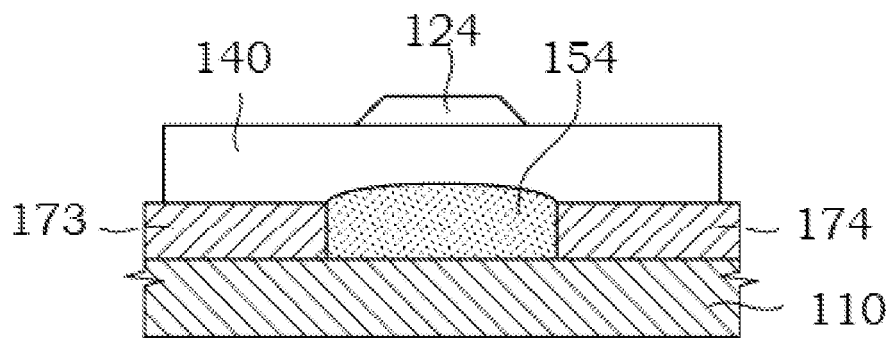
【FIG. 3C】
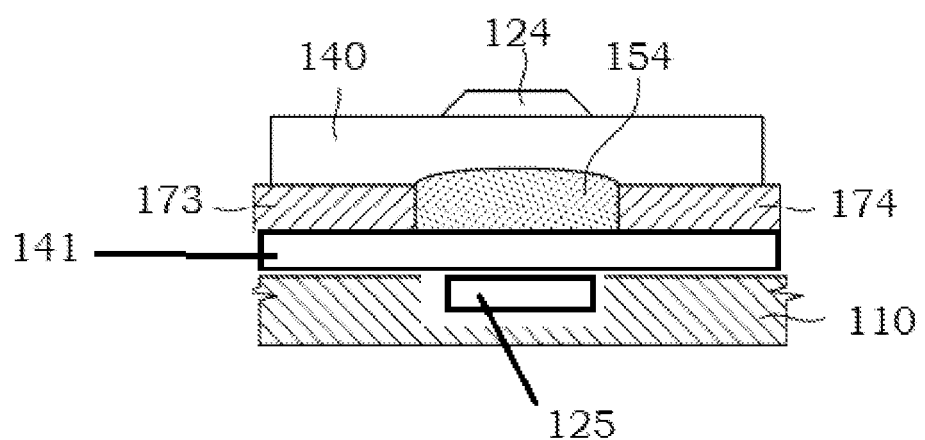

【FIG. 3D】
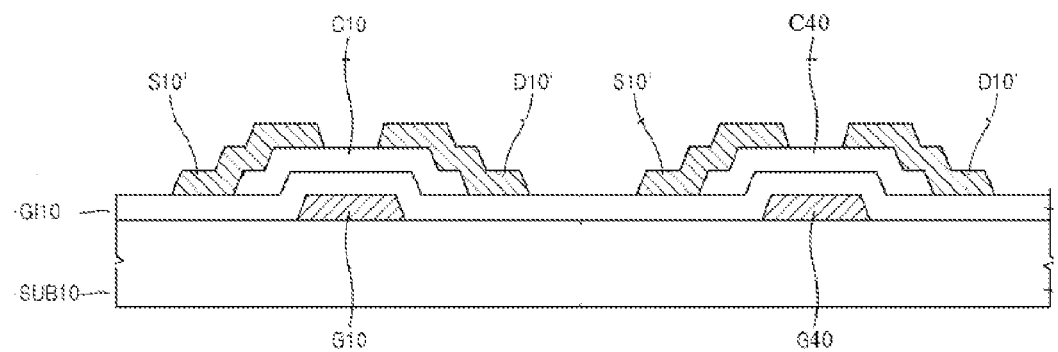
【FIG. 3E】
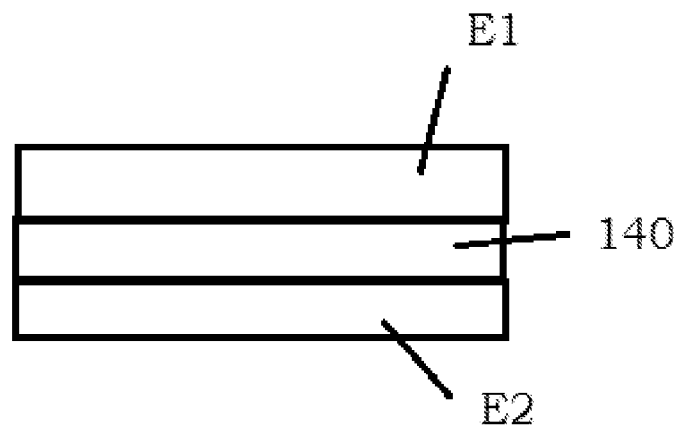

[FIG. 4]
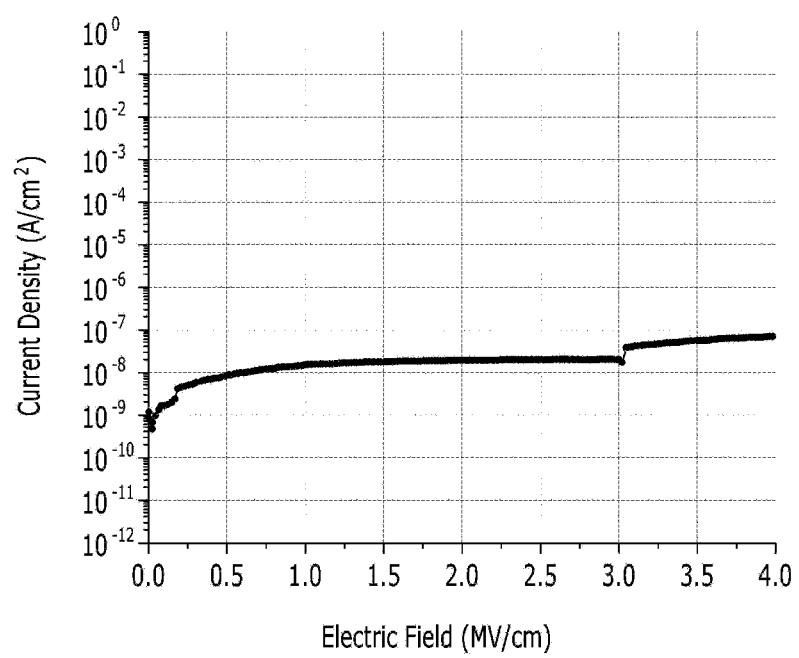

【FIG. 5】
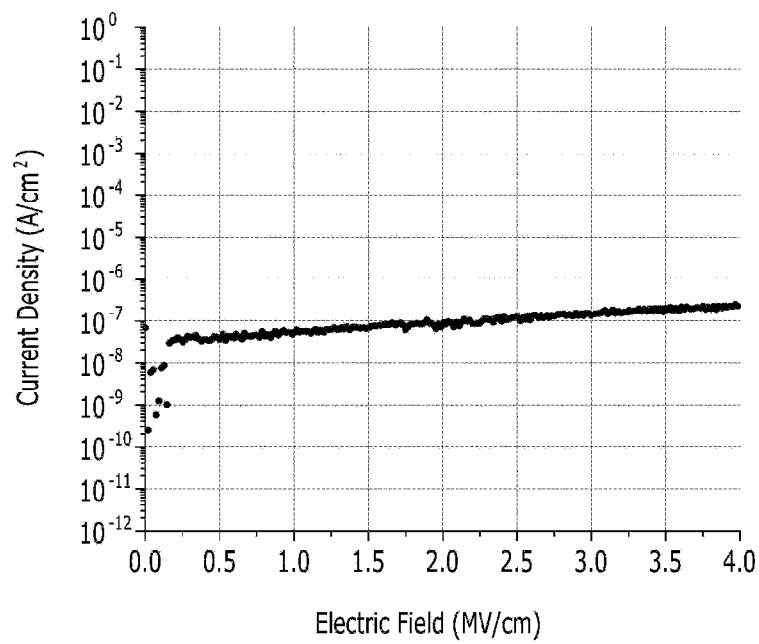
【FIG. 6】
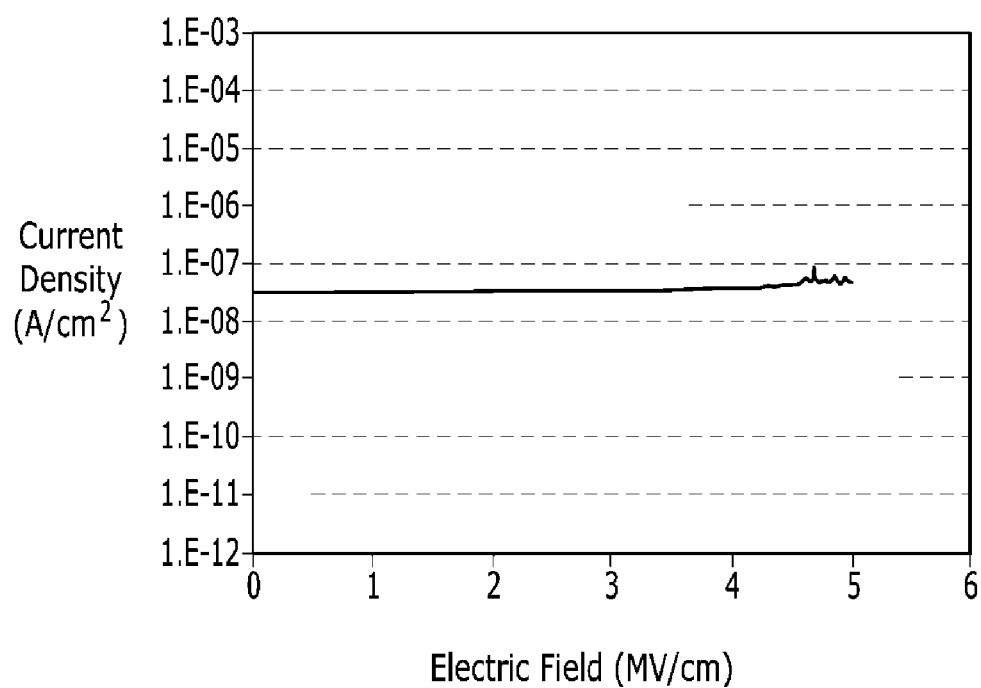

【FIG. 7】
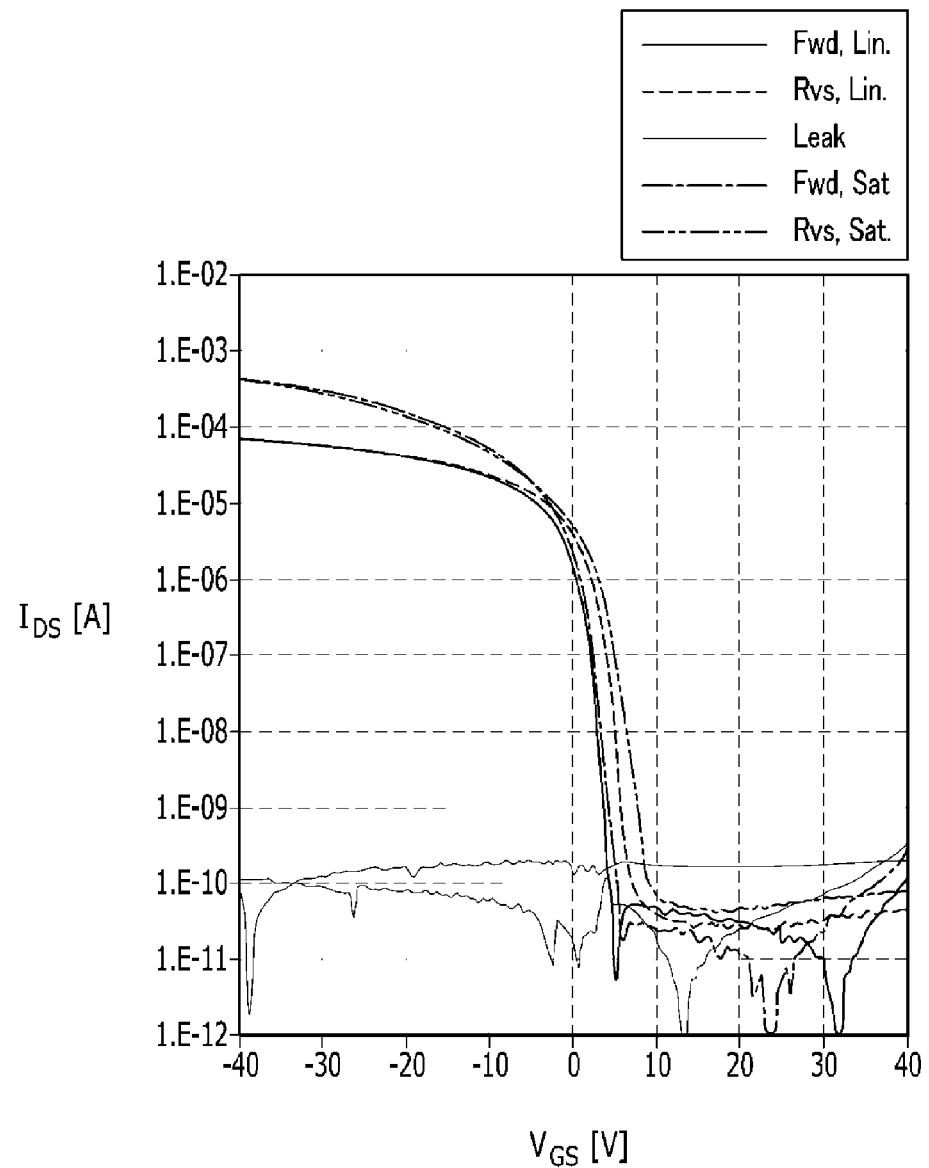

【FIG. 8】
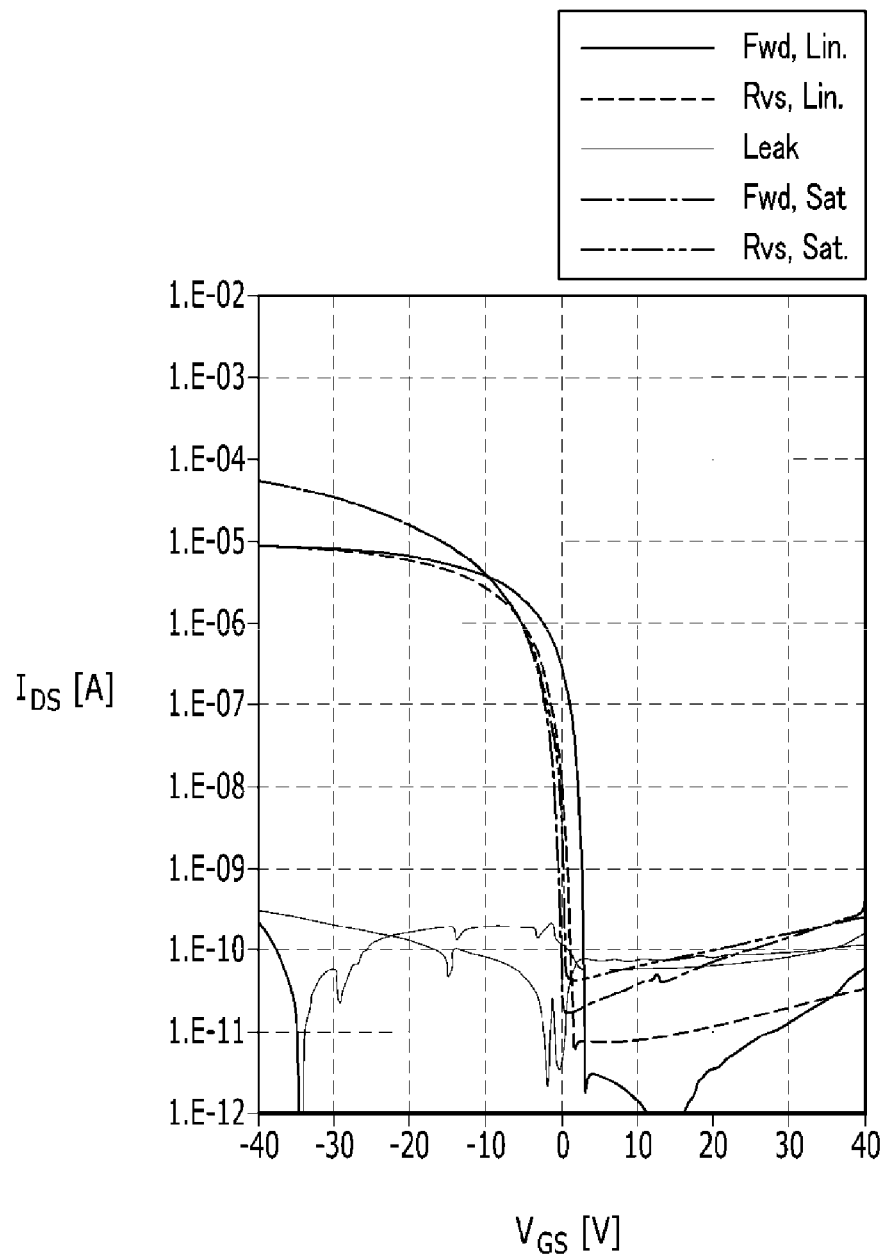

[FIG. 9]
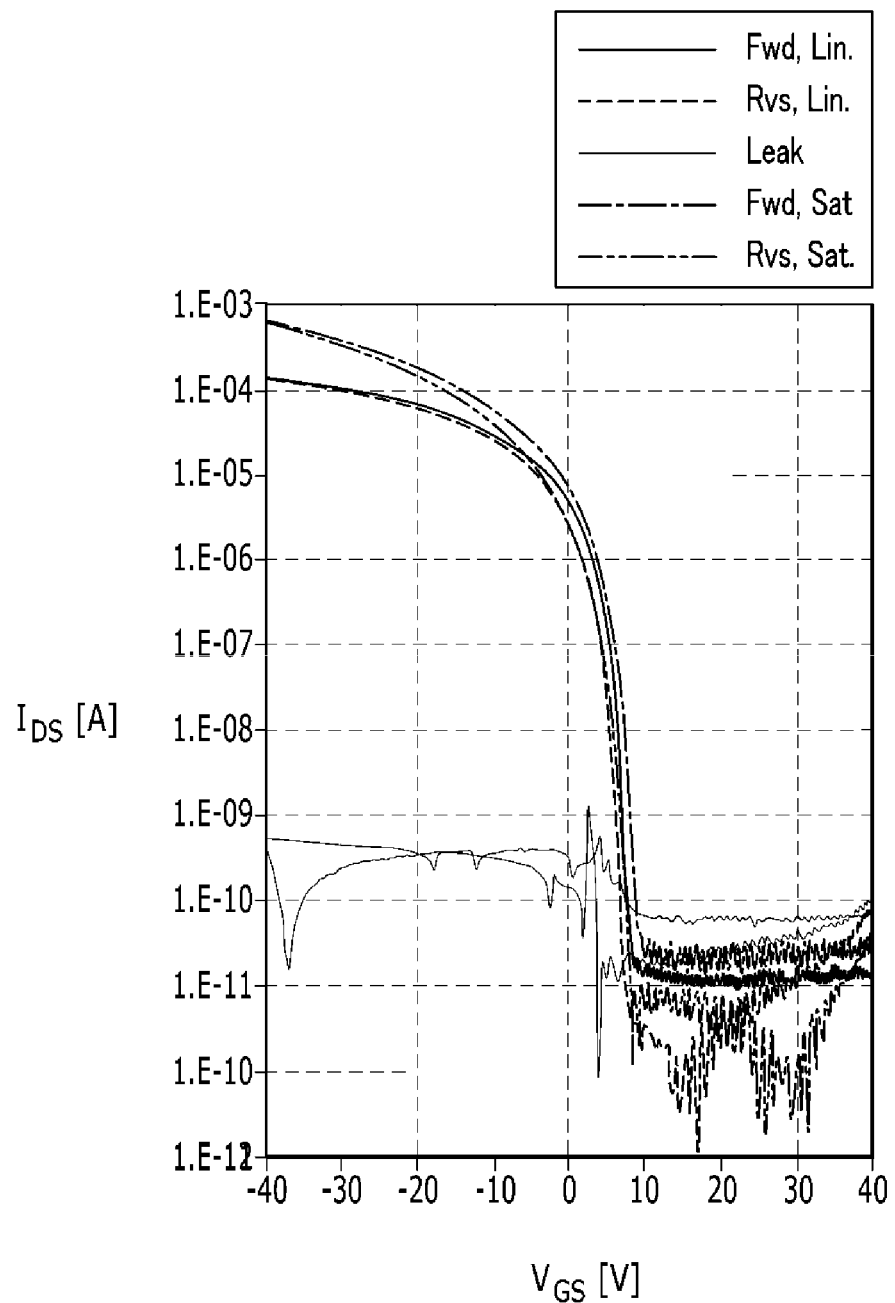

COMPOSITION, ELECTRONIC DEVICE, AND THIN FILM TRANSISTOR

CROSS REFERENCE TO RELATED APPLICATION

This application claims priority under 35 U.S.C. § 119 to Korean Patent Application No. 10-2015-0122983, filed in the Korean Intellectual Property Office on Aug. 31, 2015, the entire contents of which are incorporated herein by reference.

BACKGROUND

1. Field

Example embodiments relate to a composition, an electronic device including the composition, and a thin film transistor.

2. Description of Related Art

A flat panel display (e.g., a liquid crystal display (LCD), an organic light emitting diode (OLED) display, and/or an electrophoretic display) include a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pair of the electric field-generating electrodes is commonly connected to a switching device and receives an electrical signal, and the electrical optical active layer transforms the electrical signal into an optical signal and thus displays an image.

The flat panel display includes a thin film transistor panel having a thin film transistor (TFT), which is a three-terminal element as a switching device, a gate line transmitting a scan signal for controlling the thin film transistor, and a data line transmitting a signal applied to a pixel electrode.

The thin film transistor may have characteristics, for example, mobility, a leakage current, and an $I_{on}/I_{off}$ ratio, and/or performance of a gate insulator, determined by various factors, among which the performance of a gate insulator contacting a semiconductor is important.

SUMMARY

Example embodiments provide a composition capable of being applied as a gate insulator having high transparency, high heat resistance, and thus high reliability, as well as being capable of crosslinked by heat and light to be patternable.

Example embodiments provide an electronic device including a cured material of the composition.

Example embodiments provide a thin film transistor including a cured material of the composition.

According to example embodiments, a composition may include a product of condensation reaction between a thermal cross-linking agent and a product of hydrolysis and condensation polymerization of a compound represented by Chemical Formula 1:

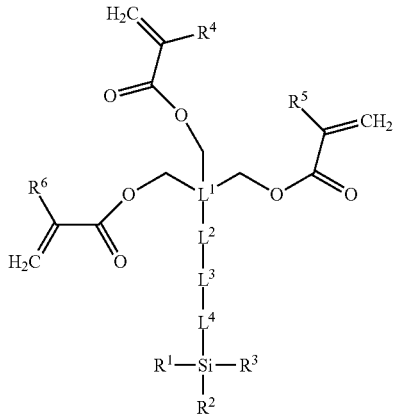

Chemical Formula 1

In Chemical Formula 1, $R^1$, $R^2$, and $R^3$ are each independently one of hydrogen, a C1 to C20 alkoxy group, a hydroxyl group, a halogen, a carboxyl group, a substituted or unsubstituted C1 to C20 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkylnyl group, or a combination thereof, provided that at least one of $R^1$, $R^2$, and $R^3$ is one of a C1 to C20 alkoxy group, a hydroxyl group, a halogen, or a carboxyl group. Also, $R^4$ to $R^6$ are each independently hydrogen, or a C1 to C20 alkyl group, $L^1$ is a carbon atom, $L^2$ and $L^4$ are each independently a substituted or unsubstituted C1 to C20 alkylene group, a substituted or unsubstituted C6 to C20 arylene group, a substituted or unsubstituted C3 to C20 cycloalkylene group, a substituted or unsubstituted C2 to C20 alkenylene group, a substituted or unsubstituted C2 to C20 alkynylene group, —R—O—R'—, —R—N—R'—, —R—(C=O)—R'— (wherein, R and R' are independently C1 to C10 hydrocarbon group), or a combination thereof, and $L^3$ is one of —O—(C=O)—NR"—, —(C=O)—NR"— (wherein, R" is hydrogen, or a C1 to C6 hydrocarbon group), —O—, —COO—, or —S—.

In example embodiments, in Chemical Formula 1, $R^1$, $R^2$, and $R^3$ may each be independently a C1 to C6 alkoxy group.

In example embodiments, in Chemical Formula 1, $L^2$ and $L^4$ may each be independently a C1 to C20 alkylene group.

In example embodiments, in Chemical Formula 1, $L^3$ may be —(C=O)—NR"— (wherein, R" is hydrogen, or a C1 to C6 hydrocarbon group).

In example embodiments, in Chemical Formula 1, $R^4$ to $R^6$ may each independently be one of hydrogen or a methyl group.

In example embodiments, the thermal cross-linking agent may include at least one acetate compound of a metal. The metal be one of aluminum (Al), zirconium (Zr), titanium (Ti), magnesium (Mg), hafnium (Hf), and tin (Sn).

In example embodiments, the thermal cross-linking agent is at least one of aluminum acetoacetate, zirconium acetoacetate, titanium acetoacetate, magnesium acetoacetate, hafnium acetoacetate, and tin acetoacetate.

In example embodiments, the thermal cross-linking agent may be included in an amount of less than or equal to about 40 parts by weight based on 100 parts by weight of the product of hydrolysis and condensation polymerization of the compound represented by Chemical Formula 1 to perform condensation reaction with the product of hydrolysis and condensation polymerization of the compound represented by Chemical Formula 1.

In example embodiments, the thermal cross-linking agent may be included in an amount of about 0.01 to about 30 parts by weight based on 100 parts by weight of the product of hydrolysis and condensation polymerization of the compound represented by Chemical Formula 1 to perform condensation reaction with the product of hydrolysis and condensation polymerization of the compound represented by Chemical Formula 1.

In example embodiments, the composition may further include a nanoparticle linked through chemical bonding to the product of hydrolysis and condensation polymerization of the compound represented by Chemical Formula 1.

In example embodiments, the nanoparticle may include at least one of silica, titania, barium titanate, zirconia, barium sulfate, alumina, hafnium oxide, and a combination thereof.

In example embodiments, the nanoparticle and the product of hydrolysis and condensation polymerization of the compound represented by Chemical Formula 1 may form a three dimensional network structure through chemical bonding.

In example embodiments, the nanoparticle and the product of hydrolysis and condensation polymerization of a compound represented by Chemical Formula 1 may form a core-shell structure.

In example embodiments, the nanoparticle may be included in an amount of less than or equal to about 40 parts by weight based on 100 parts by weight of the product of hydrolysis and condensation polymerization of the compound represented by Chemical Formula 1.

In example embodiments, the composition may further include at least one of a photo-initiator, a photo acid generator, and a dispersing agent.

According to example embodiments, an electronic device may include a cured material of the composition according to example embodiments.

In example embodiments, the electronic device may be at least one of a solid lighting device, a display device, and a combination thereof.

In example embodiments, the solid lighting device may include at least one of a semiconductor light-emitting diode, an organic light-emitting diode, and a polymer light-emitting diode. In example embodiments, the display device may include at least one of an electronic paper, a liquid crystal display, an organic light-emitting diode display, and a quantum dot display.

According to example embodiments, a thin film transistor may include a gate electrode, a semiconductor on the gate electrode, an insulator between the gate electrode and the semiconductor, and a source electrode and a drain electrode electrically connected to the semiconductor. The insulator may include a cured material of the composition according to example embodiments above.

In example embodiments, the semiconductor may be an organic semiconductor.

In example embodiments, a capacitor may include a first electrode, a second electrode on the first electrode, and an insulating layer between the first electrode and the second electrode. The insulating layer may include a cured material of the composition according to example embodiments.

BRIEF DESCRIPTION OF THE DRAWINGS

The foregoing and other features of inventive concepts will be apparent from the more particular description of non-limiting embodiments of inventive concepts, as illustrated in the following drawings:

FIG. 1 is a schematic view showing a nanoparticle-polyorganosiloxane composite according to example embodiments;

FIG. 2 is a schematic view enlarging a region "A" in FIG. 1;

FIG. 3A is a cross-sectional view showing a thin film transistor panel according to example embodiments;

FIGS. 3B and 3C are cross-sectional views of a thin film transistor and a dual-gate transistor according to example embodiments;

FIG. 3D is a cross-sectional view of an electronic device according to example embodiments FIG. 3E is a cross-sectional view of a capacitor according to example embodiments;

FIG. 4 is a graph showing insulation strength of a thin film transistor according to Preparation Example 1;

FIG. 5 is a graph showing insulation strength of a thin film transistor according to Preparation Example 2;

FIG. 6 is a graph showing insulation strength of a thin film transistor according to Preparation Example 3;

FIG. 7 is a graph showing charge mobility of a thin film transistor according to Preparation Example 1;

FIG. 8 is a graph showing charge mobility of a thin film transistor according to Preparation Example 2; and FIG. 9 is a graph showing charge mobility of a thin film transistor according to Preparation Example 3.

DETAILED DESCRIPTION

The present disclosure will be described more fully hereinafter with reference to the accompanying drawings, in which some example embodiments are shown. However, this disclosure may be embodied in many different forms and is not construed as limited to the example embodiments set forth herein. In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it may be directly on the other element or intervening elements may also be present. In contrast, when an element is referred to as being "directly on" another element, there are no intervening elements present. Other words used to describe the relationship between elements or layers should be interpreted in a like fashion (e.g., "between" versus "directly between," "adjacent" versus "directly adjacent," "connected" versus "directly connected"). As used herein the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, an insulating composition according to example embodiments is described.

An insulating composition according to example embodiments includes a product of condensation reaction between a thermal cross-linking agent and a product of hydrolysis and condensation polymerization of a compound represented by Chemical Formula 1:

Chemical Formula 1

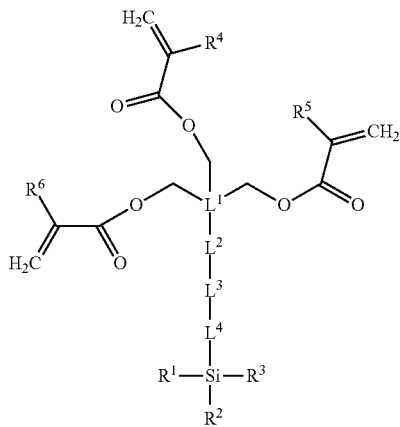

In Chemical Formula 1, $R^1$, $R^2$, and $R^3$ are independently hydrogen, a C1 to C20 alkoxy group, a hydroxyl group, a halogen, a carboxyl group, a substituted or unsubstituted C1 to C20 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkylnyl group, or a combination thereof, provided that at least one of $R^1$, $R^2$, and $R^3$ is a C1 to C20 alkoxy group, a hydroxyl group, a halogen, or a carboxyl group. Also, $R^4$ to $R^6$ are independently a hydrogen, or a C1 to C20 alkyl group. $L^1$ is a carbon atom. $L^2$ and $L^4$ are independently a substituted or unsubstituted C1 to C20 alkylene group, a substituted or unsubstituted C6 to C20 arylene group, a substituted or unsubstituted C3 to C20 cycloalkylene group, a substituted or unsubstituted C2 to C20 alkenylene group, a substituted or unsubstituted C2 to C20 alkynylene group, —R—O—R'—, —R—N—R'—, —R—(C=O)—R'— (wherein, R and R' are independently C1 to C10 hydrocarbon group), or a combination thereof, and $L^3$ is —O—(C=O)—NR"—, —(C=O)—NR"— (wherein, R" is hydrogen, or a C1 to C6 hydrocarbon group), —O—, —COO—, or —S—.

The compound represented by Chemical Formula 1 includes a silane functional group at an end and an acrylic group at another end. Accordingly, the compound represented by Chemical Formula 1 may form a polyorganosiloxane having a chain structure and/or network structure by chemical bonding between the silane functional groups through hydrolysis and condensation/polymerization. Further, the compound represented by Chemical Formula 1 may be photo cross-linked by the (meth)acrylic groups, and thus denser photo crosslinking may be performed among the compounds, as three (meth)acrylic groups are linked to each siloxane unit. In this way, the compound represented by Chemical Formula 1 may form a polyorganosiloxane having a dense net structure through hydrolysis, and condensation/polymerization reactions and photo cross-linking among the compounds.

Further, the compound represented by Chemical Formula 1 includes linking groups represented by $L^2$, $L^3$, and $L^4$ between the silane functional group and the acrylic group, thus can maintain stability of the composition including the compound represented by Chemical Formula 1. Without the linking groups, storage stability of the compound including both the silane functional group and the acrylic group may not be guaranteed due to the high reactivity between the compounds.

In Chemical Formula 1, $L^1$ may be a carbon atom.

In Chemical Formula 1, at least one of $R^1$, $R^2$, and $R^3$ may be a C1 to C6 alkoxy group. For example, all of $R^1$, $R^2$, and $R^3$ may independently be a C1 to C6 alkoxy group.

The C1 to C6 alkoxy group may be methoxy or ethohxy group, and is not limited thereto.

If all of $R^1$, $R^2$, and $R^3$ are independently one of a C1 to C20 alkoxy group, hydroxyl group, halogen, or a carboxyl group, the polyorganosiloxane obtained by hydrolysis and condensation/polymerization reactions among the compound represented by Chemical Formula 1 may include a structural unit represented by Chemical Formula 2:

Chemical Formula 2

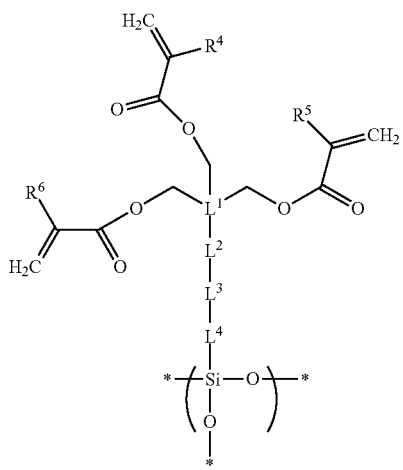

In Chemical Formula 2, $R^4$ to $R^6$, and $L^1$ to $L^4$ are defined as in Chemical Formula 1.

The polyorganosiloxane represented by Chemical Formula 2 may be cured to a dense polyorganosiloxane as the (meth)acrylic groups at an end is cross-linked through photo curing reaction. Particularly, much denser photo cross-linking may be performed due to three (meth)acrylic groups linked to each siloxane unit.

In example embodiments, $R^1$, $R^2$, and $R^3$ in Chemical Formula 1 may independently be a C1 to C6 alkoxy group, for example, a methoxy or an ethoxy, and are not limited thereto.

In Chemical Formulae 1 and 2, $L^2$ and $L^4$ may independently be a C1 to C20 alkylene group, and are not limited thereto.

In Chemical Formulae 1 and 2, $L^3$ may be —O—(C=O)—NR″—, wherein R″ is hydrogen or a C1 to C6 hydrocarbon group, and is not limited thereto.

In Chemical Formulae 1 and 2, $R^4$ to $R^6$ may be hydrogen or methyl group. In example embodiments, all of $R^4$ to $R^6$ may be hydrogen, but example embodiments are not limited thereto.

The thermal cross-linking agent may perform condensation reaction with an unreacted silanol group of a polyorganosiloxane, which is a product of hydrolysis and condensation polymerization of the compound represented by Chemical Formula 1. In this way, a denser three dimensional network structure is formed, as a metal particle derived from the thermal cross-linking agent is further crosslinked to the polyorganosiloxane, and a more stable product may be obtained by reducing unreacted silanol groups therein.

The thermal cross-linking agent may be at least one acetate compound of a metal selected from a group consisting of aluminum (Al), zirconium (Zr), titanium (Ti), magnesium (Mg), hafnium (Hf), and tin (Sn). For example, the thermal cross-linking agent may be at least one selected from a group consisting of aluminum acetoacetate, zirconium acetoacetate, titanium acetoacetate, magnesium acetoacetate, hafnium acetoacetate, and tin acetoacetate, and is not limited thereto.

The product of condensation reaction of the thermal cross-linking agent (e.g., Al acetyl acetonate, Zn acetyl acetonate, Sn acetyl acetonate, and the like) and the product of hydrolysis and condensation polymerization of a compound represented by Chemical Formula 1 may include the following structural unit as represented by Chemical Formula 3:

Chemical Formula 3

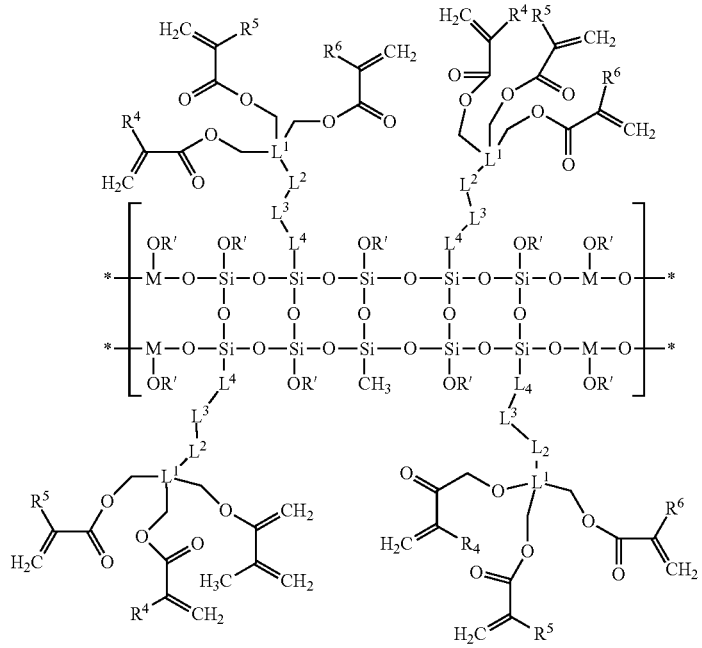

In Chemical Formula 3, M indicates the metal (e.g., Al, Zn, Sn, etc.) derived from the thermal cross-linking agent. For example, M may be Al derived from an Aluminum (Al) acetate compound. In Chemical Formula 3, $R^4$ to $R^6$, R', and $L^1$ to $L^4$ are defined as in Chemical Formula 1.

The thermal cross-linking agent may be included in an amount of less than or equal to about 40 parts by weight based on 100 parts by weight of the product of hydrolysis and condensation polymerization of a compound represented by Chemical Formula 1, and may perform condensation reaction with the product of hydrolysis and condensation polymerization of a compound represented by Chemical Formula 1. For example, the thermal cross-linking agent may be included in an amount of about 0.01 to about 30 parts by weight, for example, in an amount of about 0.03 to about 25 parts by weight, based on 100 parts by weight of the product of hydrolysis and condensation polymerization of a compound represented by Chemical Formula 1, such that it may perform condensation reaction with the product of hydrolysis and condensation polymerization of a compound represented by Chemical Formula 1.

The composition may further include a nanoparticle linked to the product of hydrolysis and condensation polymerization of a compound represented by Chemical Formula 1 through chemical bonding.

The nanoparticle is not particularly limited as long as it has a several nanometers to tens of nanometers of an average particle diameter, and, for example, may be a metal oxide and/or a metalloid oxide. The metal oxide and/or a metalloid oxide may be, for example, silica, titania, barium titanate, zirconia, barium sulfate, alumina, hafnium oxide, or a combination thereof, and is not limited thereto.

The nanoparticle may be, for example, in a sol state (referred to as 'nano-sol').

The nano-sol may have a reaction site on a surface of the nanoparticle, which is, for example, at least one selected from hydroxyl group, alkoxy group, halogen, carboxyl group, and a combination thereof, at which a condensation/polymerization reaction may take place.

Accordingly, the chemical bonding between the nanoparticle and the product of hydrolysis and condensation polymerization of the compound represented by Chemical Formula 1 may also be formed via, for example, a condensation/polymerization reaction at the reaction site of the nano-sol during the process of preparing a polyorganosiloxane having a chain structure and/or a net structure through hydrolysis and condensation reaction of the compounds represented by Chemical Formula 1. In this way, the nanoparticle and the product of hydrolysis and condensation polymerization of a compound represented by Chemical Formula 1 may form a nanoparticle-polyorganosiloxane composite having a three dimensional network structure through chemical bonding.

The nanoparticle-polyorganosiloxane composite may have a larger average particle diameter than the nanoparticle, and for example, may have an average particle diameter of about 2 nm to about 200 nm.

FIG. 1 is a schematic view showing a nanoparticle-polyorganosiloxane composite according to example embodiments. FIG. 2 enlarges a region "A" in FIG. 1.

Referring to FIG. 1, a nanoparticle-polyorganosiloxane composite 10 according to example embodiments includes a plurality of nanoparticles 11 and polyorganosiloxane 12 chemically bonded with each nanoparticle 11 and randomly disposed therein. The nanoparticle 11 may have, for example, a spherical shape, and the polyorganosiloxane 12 may include a chain structure and/or a net structure. The nanoparticle 11 and the polyorganosiloxane 12 form a three-dimensional network structure through a chemical bond.

Referring to FIG. 2, each nanoparticle 11 has a plurality of bonding sites and is chemically bonded with the polyorganosiloxane 12. For example, each nanoparticle-polyorganosiloxane composite 10 may have a core-shell structure where the polyorganosiloxane 12 surrounds the nanoparticle 11, but is not limited thereto. In FIG. 2, the polyorganosiloxane except for the silane functional group is abbreviated as 'R'.

The nanoparticle may be included in an amount of less than or equal to about 40 parts by weight, for example, from about 1 parts by weight to about 30 parts by weight, for example, from about 2 parts by weight to about 20 parts by weight, for example, from about 2 parts by weight to about 10 parts by weight, based on 100 parts by weight of the product of hydrolysis and condensation polymerization of the compound represented by Chemical Formula 1.

The composition may further include at least one selected from a group consisting of a photo initiator, a photo acid generator, and a dispersing agent.

By including a photo initiator and/or a photo acid generator, photo cross-linking between the (meth)acrylic groups at an end of the polyorganosiloxane is promoted when the composition is coated on a substrate and subjected to a photo curing.

The photo initiator and photo acid generator are not particularly limited. The photo initiator may include one of IRGACURE® (manufactured by BASF) 127 (di-functional, α-hydroxy ketone photoinitiator, sensitive to UV light excitation), 184 (1-hydorxy-cyclohexyl-phenyl-ketone), 754 (oxy-phenyl-acetic acid 2-[2 oxo-2 phenyl-acetoxy-ethoxy]-ethyl ester liquid MP and oxy-phenyl-acetic 2-2-hydroxy-ethoxy]-ethyl ester) 784 (Bis (eta 5-2,4-cyclopentadien-1-yl) Bis [2,6-difluoro-3-(1H-pyrrol-1-yl) phenyl]titanium, marketed by BASF), 819 (Phosphine oxide, phenyl bis (2,4,6-trimethyl benzoyl), marked by BASF), OXE01 (1,2-Octanedione, 1-[4-(phenylthio)phenyl]-, 2-(Obenzoyloxime), marketed by BASF), OXE 02 (Ethanone, 1-[9-ethyl-6-(2-methylbenzoyl)-9H-carbazol-3-yl]-, 1-(O-acetyloxime)), and the like. The photo acid generator may include one of IRGACURE® (manufactured by BASF) CGI 725 and CGI 1907, and the like. However, example embodiments are not limited thereto.

The composition may further include a solvent. By further including a solvent, viscosity of the composition may appropriately be adjusted. In example embodiments, a dispersion may include the composition dispersed in the solvent. The dispersion may include at one least one nanoparticle bonded with the polyorganosiloxane 12 according to example embodiments and dispersed in the solvent. The dispersion may include the nanoparticle-polyorganosiloxane composite 10 according to example embodiments in FIG. 1 dispersed in the solvent.

The solvent is not particularly limited, and may be, for example, an aliphatic hydrocarbon solvent (e.g., hexane); an aromatic hydrocarbon solvent (e.g., anisole, mesitylene, and/or xylene); a ketone based solvent (e.g., methylisobutylketone, 1-methyl-2-pyrrolidinone, cyclohexanone, and/or acetone); an ether based solvent (e.g., tetrahydrofuran, and/or diisopropylether); an acetate based solvent (e.g., ethylacetate, butylacetate, and/or propylene glycolmethyletheracetate); an alcohol-based solvent (e.g., isopropyl alcohol and/or butanol); an amide-based solvent (e.g., dimethylacetamide and/or dimethylformamide); a silicone-based solvent; or a combination thereof.

The composition is coated on a substrate or a lower layer and subjected to a photo cure to become a cured material. With the aid of the photo cure, the acrylic groups of the polyorganosiloxane may be photo cured, whereby the polyorganosiloxane can have a denser film property.

In this way, the composition according to an embodiment may have superior insulator properties, such as, for example, high insulating strength, high dielectric constant, high thermal resistance, high chemical resistance, long time stability, and the like, when applied to an insulator, as the compound represented by Chemical Formula 1 forms a polyorganosiloxane having a dense network structure. Therefore, when the insulator is used as a gate insulator for a thin film transistor, a leakage current may be reduced and the properties of a thin film transistor may be improved due to the superior film properties and relatively high insulation strength.

Further, as the insulator is an organic/inorganic composite insulator, it can be simply formed in a solution process, unlike an inorganic insulator.

The insulator may be used in a field requiring insulation characteristics of an electronic device, for example, as a gate insulator, a dielectric material, and/or a filler.

Further, the composition may be photo cured, and it is possible to form a pattern by coating the composition on a substrate, drying the same, placing a mask having a predetermined pattern thereon, and irradiating the same. In this way, the irradiated part is cured to form a cured material, while the part that is not irradiated is washed out by a developer, to form a predetermined pattern. In this case, the cured material prepared from the composition may have a high resolution of, for example, less than or equal to about 100 μm, for example, less than or equal to about 50 μm, for example, less than or equal to about 30 μm, for example, less than or equal to about 20 μm, for example, less than or equal to about 10 μm, for example, less than or equal to about 7 μm. Accordingly, the cured material may efficiently be used as a planarization film, a protective film, a barrier film, and the like, and is not limited thereto.

Accordingly, an electronic device according to example embodiments may include a cured material obtained by curing the above composition according to example embodiments.

The electronic device may be at least one selected from a group consisting of a solid lighting device, a display device, and a combination thereof.

The solid lighting device may include at least one selected from a group consisting of a semiconductor light-emitting diode, an organic light-emitting diode, and a polymer light-emitting diode, and is not limited thereto.

The display device may include at least one selected from a group consisting of an electronic paper, a liquid crystal display, an organic light-emitting diode display, and a quantum dot display, and is not limited thereto.

Hereinafter, various electronic devices, which include the insulator according to example embodiments, are described. FIG. 3A is a cross-sectional view showing a thin film transistor according to example embodiments. FIGS. 3B and 3C are cross-sectional views of a thin film transistor and a dual-gate transistor according to example embodiments. FIG. 3D is a cross-sectional view of an electronic device according to example embodiments. FIG. 3E is a cross-sectional view of a capacitor according to example embodiments.

Referring to FIG. 3A, a thin film transistor according to example embodiments includes a gate electrode 124 disposed on a substrate 110, a semiconductor 154 overlapping the gate electrode 124, a gate insulator 140 interposed between the gate electrode 124 and the semiconductor 154, and a source electrode 173 and a drain electrode 175 that are electrically connected to the semiconductor 154.

The substrate 110 may be made of, for example, transparent glass, silicon, or a polymer. The gate electrode 124 is connected to a gate line (not shown)transmitting a data signal, and may be made of, for example, gold (Au), copper(Cu), nickel(Ni), aluminum (Al), molybdenum(Mo), chromium(Cr), tantalum(Ta), titanium(Ti), an alloy thereof, and a combination thereof, but is not limited thereto.

The semiconductor 154 may be an organic semiconductor or an inorganic semiconductor, and, for example, an organic semiconductor. The organic semiconductor may be, for example, at least one selected from pentacene and a derivative thereof, tetrabenzoporphyrin and a derivative thereof, polyphenylenevinylene and a derivative thereof, polyfluorene and a derivative thereof, polythienylenevinylene and a derivative thereof, polythiophene and a derivative thereof, polythienothiophene and a derivative thereof, polyarylamine and a derivative thereof, phthalocyanine and a derivative thereof, metallized phthalocyanine and a halogenate derivative thereof, perylenetetracarboxylic dianhydride(PTCDA), naphthalenetetracarboxylic dianhydride (NTCDA) or an imide derivative thereof, perylene or coronene and substituent-containing derivatives thereof, but is not limited thereto.

The gate insulator 140 may be prepared from the above composition, for example, by coating the above composition, photo-curing, and/or thermally curing it to prepare a film. The semiconductor 154 may be formed on the gate insulator 140 using a deposition process in a temperature range of about 70° C. to about 150° C., or may be up to 250° C. depending on the organic semiconductor material.

The source electrode 173 and the drain electrode 175 face each other with the semiconductor 154 therebetween, and are electrically connected to semiconductor 154. The source electrode 173 is connected to a data line (not shown) transmitting a data signal. The source electrode 173 and the drain electrode 175 may be, for example, made of gold (Au), copper(Cu), nickel(Ni), aluminum (Al), molybdenum(Mo), chromium(Cr), tantalum(Ta), titanium(Ti), an alloy thereof and a combination thereof, but are not limited thereto. The source electrode 173 and drain electrode 175 may be formed by sputtering a metal or metal alloy on the semiconductor 154 and patterning the metal or metal alloy. The source electrode 173 and drain electrode 175 may be formed at room temperature (e.g., 25° C.), but are not limited thereto.

FIGS. 3B and 3C are cross-sectional views of a thin film transistor and a dual-gate transistor according to example embodiments.

Referring to FIG. 3B, a thin film transistor according to example embodiments may be similar to the thin film transistor described in FIG. 3A, except for having a top-gate structure instead of a bottom-gate structure. As illustrated in FIG. 3B, the thin film transistor may include the semiconductor 154, between the source electrode 173, and the drain electrode 174 on the substrate 110. The gate insulator 140 may cover the source electrode 173, semiconductor 154, and the drain electrode 173. The gate electrode 124 may be formed on the gate insulator 140.

Referring to FIG. 3C, a thin film transistor according to example embodiments may be the same as the thin-film transistor in FIG. 3B, except for having a dual-gate structure instead of a top-gate structure. As illustrated in FIG. 3C, the thin film transistor may further include a second gate insulator 141 between the substrate 110 and the source electrode 173, semiconductor 154, and the drain electrode 174, respectively. The second gate insulator 141 and the gate insulator 140 may be formed of the same material. However, example embodiments are not limited thereto. For example, the second gate insulator 141 may alternatively be formed of a different material (e.g., silicon oxide, high-k dielectric) than the gate insulator 140.

Thin film transistors according to example embodiments in FIGS. 3A to 3C may be applied to various electronic devices, for example, a semiconductor device, a flat panel display, an energy device, and a sensor. The electronic device may include, for example, a liquid crystal display (LCD), an organic light emitting diode (OLED) device, a solar cell, and an organic sensor.

FIG. 3D is a cross-sectional view of an electronic device according to example embodiments.

Referring to FIG. 3D, the electronic device may include a first gate electrode G10 and a second gate electrode G40 spaced apart from each other on a substrate SUB10. A gate insulator GI10 may be on the first gate electrode G10, second gate G40 and substrate SUB10. A first channel C10 and a second channel C40 may be on the gate insulator GI10 over the first gate electrode G10 and the second gate electrode G40, respectively. Source and drain electrodes S10' and D10' may be connected to respective ends of the first channel C10 and the second channel C40, respectively, on top of the gate insulator GI10.

The substrate SUB10 may be made of an insulator, semiconductor, or polymer. For example, the substrate SUB10 may be formed of transparent glass, silicon, or a polymer. The gate electrodes G10 and G40 are connected to respective gate lines (not shown) for transmitting data signals, and may be made of a metal or metal alloy, but are not limited thereto. For example, the gate electrodes G10 and G40 may each independently include one of gold (Au), copper(Cu), nickel(Ni), aluminum (Al), molybdenum(Mo), chromium(Cr), tantalum(Ta), titanium(Ti), an alloy thereof, and a combination thereof, but are not limited thereto.

FIG. 3E is a cross-sectional view of a capacitor according to example embodiments. The capacitor may include an insulator 140 formed between a first electrode E1 on a second electrode E2. The first and second electrode E1 and E2 may each independently include one of gold (Au), copper(Cu), nickel(Ni), aluminum (Al), molybdenum(Mo), chromium(Cr), tantalum(Ta), titanium(Ti), an alloy thereof, and a combination thereof, but are not limited thereto. The insulator 140 may be prepared from the above composition, for example, by coating the above composition, photo-curing, and/or thermally curing it to prepare a film.

Hereinafter, the present disclosure is illustrated in more detail with reference to examples. However, inventive concepts are not limited thereto.

EXAMPLES

Comparative Example 1

Synthesis of Product of Condensation Reaction between Polyorganosiloxane and Thermal Cross-linking Agent 1000 g of methanol is put into a reactor equipped with a reflux condenser that is capable of agitation and made of a glass material, and 672.8 g of the silane compound represented by the following Chemical Formula 4 is added thereto. The mixture is agitated at room temperature for 1 hour. Then, 56 g of aqueous solution of HCl (0.1 N) is added to the mixture in a dropwise fashion for 2 hours, and agitated at room temperature for another 2 hours to induce hydrolysis reaction. Subsequently, the reaction mixture is heated to 80° C. and further reacted for 36 hours to perform condensation and polymerization reactions to obtain polyorganosiloxane including a structural unit represented by the following Chemical Formula 5. The obtained polyorganosiloxane is measured to determine its weight average molecular weight as 2800, PDI (polydispersity index) as 1.79 (in a GPC method), viscosity as 5.8 cPs at 20° C., and pH as 7.

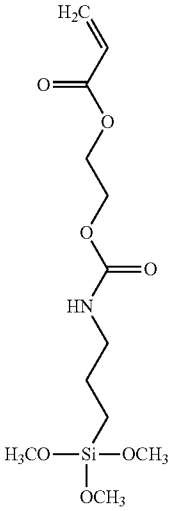

Chemical Formula 4

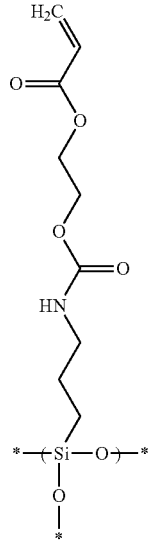

Chemical Formula 5

670 g of propylene glycol monomethyl ether acetic acid is added to the obtained polyorganosiloxane for dilution, and the mixture is distillated under a reduced pressure of 60 cm Hg, at 60° C. to remove a byproduct, obtaining the polyorganosiloxane dispersed in the propylene glycol monomethyl ether acetic acid. To the dispersed polyorganosiloxane, 1% of aluminum acetoacetate based on the weight of the polyorganosiloxane is added to induce cross-linking reaction to obtain polyorganosiloxane including alumina.

Comparative Example 2

Synthesis of Product of Condensation Reaction between Nanoparticle-polyorganosiloxane Composite and Thermal Cross-linking Agent 500 g of an aqueous alkaline silica sol is passed through a column charged with a strongly acidic cation exchange resin, obtaining an acidic silica sol having pH 2. 500 g of the obtained acidic silica sol is put into a reactor equipped with a reflux condenser that is capable of agitation and made of a glass material, and 1000 g of methanol is added thereto for dilution.

Subsequently, 11 g of glycidoxypropyl trimethoxysilane is added thereto, the mixture is agitated at room temperature for 1 hour, and then heated and reacted at 95° C. for 6 hours to perform a surface treatment of silica. Then, the surface-treated silica sol is distillated under a reduced pressure of 50 mmHg, at 80° C., and concentrated to 500 g by removing a part of water included therein.

The distillation under a reduced pressure is additionally performed four times under the same conditions after diluting the silica sol by adding 1000 g of methanol thereto until the amount of water therein decreases to less than or equal to 1 wt %. Then, 672.8 g of the silane compound represented by Chemical Formula 4 is added thereto, and the mixture is agitated at room temperature for 1 hour. Following this, 56 g of an aqueous solution of HCl with a concentration of 0.1N is added thereto in a dropwise fashion for 2 hours, and the mixture is additionally agitated at room temperature for 2 hours to perform a hydrolysis reaction. The temperature of the resultant is then increased to 80° C. and the resultant is reacted for 36 hours to perform condensation and polymerization reactions, obtaining a silica-polyorganosiloxane composite with silica positioned in the core and polyorganosiloxane condensed and polymerized as a shell around the silica. The obtained silica-polyorganosiloxane is measured to determine its weight average molecular weight as 1800, PDI (polydispersity index) as 1.34 (in a GPC method), viscosity as 7.2 cPs at 20° C., and pH as 6.

Subsequently, 335 g of propyleneglycol monomethylether acetic acid is added to the silica-polyorganosiloxane composite for dilution, and the diluted mixture is distillated under a reduced pressure of 60 mmHg at 60° C. to remove a byproduct, obtaining a silica-polyorganosiloxane composite dispersed in the propyleneglycol monomethyl ether acetic acid. To the dispersed silica-polyorganosiloxane composite, is added 1%, based on the weight of the silica-polyorganosiloxane composite, of aluminum acetoacetate to induce cross-linking reaction to obtain silica-polyorganosiloxane composite to which alumina is crosslinked.

Example 1

Synthesis of Product of Condensation Reaction between Polyorganosiloxane having tri-acrylic groups and Thermal Cross-linking Agent 1000 g of methanol is put into a reactor equipped with a reflux condenser that is capable of agitation and made of a glass material, and 672.8 g of the silane compound represented by the following Chemical Formula 6 is added thereto. The mixture is agitated at room temperature for 1 hour. Then, 56 g of aqueous solution of HCl (0.1 N) is added to the mixture in a dropwise fashion for 2 hours, and agitated at room temperature for another 2 hours to induce hydrolysis reaction. Subsequently, the reaction mixture is heated to 80° C. and further reacted for 36 hours to perform condensation and polymerization reactions to obtain polyorganosiloxane including a structural unit represented by the following Chemical Formula 7. The obtained polyorganosiloxane is measured to determine its weight average molecular weight as 2800, PDI (polydispersity index) as 1.79 (in a GPC method), viscosity as 5.8 cPs at 20° C., and pH as 7.

Chemical Formula 6

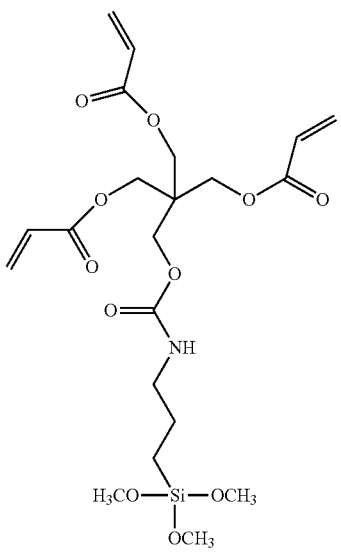

Chemical Formula 7

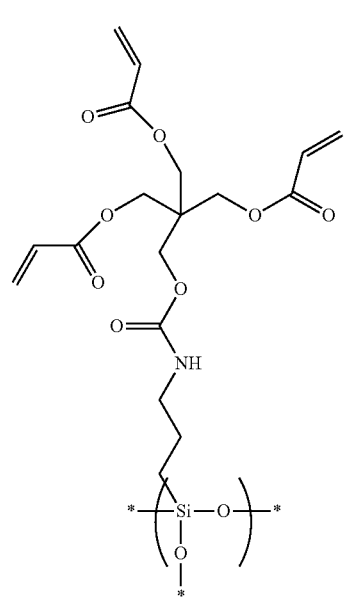

670 g of propyleneglycol monomethyl ether acetic acid is added to the obtained polyorganosiloxane for dilution, and the mixture is distillated under a reduced pressure of 60 mmHg, at 60° C. to remove a byproduct, obtaining the polyorganosiloxane dispersed in the proplyene glycol monomethyl ether acetic acid. To the dispersed polyorganosiloxane, 1% of aluminum acetoacetate based on the weight of the polyorganosiloxane is added to induce cross-linking reaction to obtain polyorganosiloxane including alumina.

Manufacture of Thin Film Transistor

Preparation Example 1

Manufacture of Thin Film Transistor by Using Product According to Comparative Example 1

Molybdenum is sputtered on a glass substrate, and then photolithography is performed to form a gate electrode. Subsequently, the condensation product of the polyorganosiloxane and thermal cross-linking agent obtained in Comparative Example 1 is spin-coated thereon, pre-annealed at 90° C. for 2 minutes, and radiated using a 200 W high pressure mercury lamp having a wavelength region of 240 nm to 400 nm for 96 seconds, followed by a post-annealing at 200 ° C. for 1 hour.

A pentacene derivative, Dibenzothiopheno[6,5-b:6',5'-f] thieno[3,2-b]thiophene (DTBTT), is then vacuum-deposited thereon, forming an organic semiconductor. Subsequently, gold (Au) is sputtered on the organic semiconductor, and photolithography is performed to form a source electrode and a drain electrode, manufacturing a thin film transistor.

Preparation Example 2

Manufacture of Thin Film Transistor by Using Product According to Comparative Example 2

A thin film transistor is manufactured according to the same method as Preparation Example 1, except for using the condensation product of the nanoparticle-polyorganosiloxane composite and thermal cross-linking agent according to Comparative Example 2.

Preparation Example 3

Manufacture of Thin Film Transistor by Using Product According to Example 1

A thin film transistor is manufactured according to the same method as Preparation Example 1, except for using the condensation product of the polyorganosiloxane-thermal cross-linking agent according to Example 1.

Evaluation

Characteristics of the thin film transistors according to Preparation Example 1 to Preparation Example 3 are evaluated. The characteristics of the thin film transistors include insulation strength, charge mobility, and $I_{on}/I_{off}$ ratio.

FIG. 4 is a graph showing the insulation strength of the thin film transistor according to Preparation Example 1. FIG. 5 is a graph showing the insulation strength of the thin film transistor according to Preparation Example 2. FIG. 6 is a graph showing the insulation strength of the thin film transistor according to Preparation Example 3.

Referring to FIGS. 4 to 6, the thin film transistor according to Preparation Example 3 shows better insulation strength compared to those according to Preparation Examples 1 and 2. Particularly, while the insulation strengths of the insulators in the thin film transistors according to Preparation Examples 1 and 2 are sufficient in the range of, for example, at a micro ampere (μA) level until about 4 mega volts (MV) level, the insulation strength of the insulator in the thin film transistor according to Preparation Example 3 is sufficient in the range of, for example, at a micro ampere (μA) level to about 5 mega volts (MV) level. That is, the thin film transistor according to Preparation Example 3 has higher electrical reliability than those according to Preparation Examples 1 and 2, as the former includes a polysiloxane substituted with three acrylic groups per siloxane unit and thus has denser photo cross-linking than the polysiloxane contained in the thin film transistors discussed above having only one acrylic group per siloxane unit.

FIG. 7 is a graph showing charge mobility in the thin film transistor according to Preparation Example 1. FIG. 8 is a graph showing charge mobility in the thin film transistor according to Preparation Example 2. FIG. 9 is a graph showing charge mobility in the thin film transistor according to Preparation Example 3.

The following Table 1 shows charge mobility, on-current value, and off-current value of the thin film transistors according to Preparation Examples 1 to 3.

TABLE 1

| | Charge mobility ($cm^2/V \cdot s$) | On-current value | Off-current value |
|---|---|---|---|
| Preparation Example 1 | 10.29 | $4.86 \times 10^{-4}$ | $3.50 \times 10^{-13}$ |
| Preparation Example 2 | 1.9 | $1.03 \times 10^{-4}$ | $6.98 \times 10^{-10}$ |
| Preparation Example 3 | 14~15 | $7.4 \times 110^{-4}$ | $1.8 \times 10^{-13}$ |

Referring to FIGS. 7 to 9, and Table 1, the thin film transistor according to Preparation Example 3 show better charge mobility, and Ion/Ioff ratio, than those according to Preparation Examples 1 and 2, and thus may be more efficiently used as an organic insulator.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims. For example, while some example embodiments only illustrate insulator and thin film transistor including same, persons skilled in the art will understand that the cured material prepared from the composition according to example embodiments may be efficiently used in various articles and electronic materials.

What is claimed is:
1. A thin film transistor comprising:
a gate electrode;
a semiconductor on the gate electrode;
an insulator disposed between the gate electrode and the semiconductor; and
a source electrode and a drain electrode electrically connected to the semiconductor, wherein the insulator includes a cured material of a composition comprising a product of condensation reaction between a thermal cross-linking agent and a product of hydrolysis and condensation polymerization of a compound represented by Chemical Formula 1, Chemical Formula 1

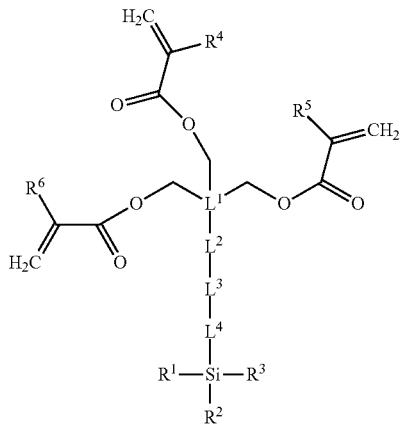

wherein, in the above Chemical Formula 1, $R^1$, $R^2$, and $R^3$ are each independently one of hydrogen, a C1 to C20 alkoxy group, a hydroxyl group, a halogen, a carboxyl group, a substituted or unsubstituted C1 to C20 alkyl group, a substituted or unsubstituted C3 to C20 cycloalkyl group, a substituted or unsubstituted C6 to C20 aryl group, a substituted or unsubstituted C7 to C20arylalkyl group, a substituted or unsubstituted C1 to C20 heteroalkyl group, a substituted or unsubstituted C2 to C20 heterocycloalkyl group, a substituted or unsubstituted C2 to C20 alkylnyl group, or a combination thereof, provided that at least one of $R^1$, $R^2$, and $R^3$ is one of a C1 to C20 alkoxy group, a hydroxyl group, a halogen, or a carboxyl group, $R^4$ to $R^6$ are each independently hydrogen, or a C1 to C20 alkyl group, $L^1$ is a carbon atom, $L^2$ and $L^4$ are each independently one of a substituted or unsubstituted C1 to C20 alkylene group, a substituted or unsubstituted C6 to C20 arylene group, a substituted or unsubstituted C3 to C20 cycloalkylene group, a substituted or unsubstituted C2 to C20 alkenylene group, a substituted or unsubstituted C2 to C20 alkynylene group, —R—O—R'—, —R—NR'—, —R—(C=O)—R'—(wherein, R and R' are independently C1 to C10 hydrocarbon group), or a combination thereof, and $L^3$ is one of —O—(C=O)—NR"—, —(C=O)—NR"— (wherein, R" is hydrogen, or a C1 to C6 hydrocarbon group), —O—, —COO—, or —S—.

2. The thin film transistor according to claim 1, wherein $R^1$, $R^2$, and $R^3$ are each independently a C1 to C6 alkoxy group.

3. The thin film transistor according to claim 1, wherein $L^2$ and $L^4$ are each independently a C1 to C20 alkylene group.

4. The thin film transistor according to claim 1, wherein $L^3$ is —O—(C=O)—NR"— (wherein, R" is hydrogen, or a C1 to C6 hydrocarbon group).

5. The thin film transistor according to claim 1, wherein $R^4$ to $R^6$ are each independently one of hydrogen or a methyl group.

6. The thin film transistor according to claim 1, wherein the thermal cross-linking agent is included in an amount of less than or equal to about 40 parts by weight based on 100 parts by weight of the product of hydrolysis and condensation polymerization of the compound represented by Chemical Formula 1 to perform the condensation reaction with the product of hydrolysis and condensation polymerization of the compound represented by Chemical Formula 1.

7. The thin film transistor according to claim 1, wherein the thermal cross-linking agent is included in an amount of about 0.01 to 30 parts by weight based on 100 parts by weight of the product of hydrolysis and condensation polymerization the compound represented by Chemical Formula 1 to perform the condensation reaction with the product of hydrolysis and condensation polymerization of the compound represented by Chemical Formula 1.

8. The thin film transistor according to claim 1, wherein the composition further comprise a nanoparticle linked through chemical bonding to the product of hydrolysis and condensation polymerization of the compound represented by Chemical Formula 1.

9. The thin film transistor according to claim 8, wherein the nanoparticle and the product of hydrolysis and condensation polymerization of the compound represented by Chemical Formula 1 form a three dimensional network structure through chemical bonding.

10. The thin film transistor according to claim 8, wherein the nanoparticle and the product of hydrolysis and condensation polymerization of the compound represented by Chemical Formula 1 form a core-shell structure.

11. The thin film transistor according to claim 8, wherein the nanoparticle includes at least one of silica, titania, barium titanate, zirconia, barium sulfate, alumina, hafnium oxide, and a combination thereof.

12. The thin film transistor according to claim 8, wherein the nanoparticle is present in an amount of less than or equal to about 40 parts by weight based on 100 parts by weight of the product of hydrolysis and condensation polymerization of the compound represented by Chemical Formula 1.

13. The thin film transistor according to claim 1, wherein the composition further comprises at least one selected of a photo-initiator, a photo acid generator, and a dispersing agent.

14. An electronic device comprising: the thin film transistor according to claim 1.

15. The electronic device according to claim 14, wherein the electronic device is at least one of a solid lighting device, a display device, and a combination thereof.

16. The electronic device according to claim 15, wherein the solid lighting device is at least of a semiconductor light-emitting diode, an organic light-emitting diode, and a polymer light-emitting diode, and the display device is at least one of an electronic paper, a liquid crystal display, an organic light-emitting diode display, and a quantum dot display.

17. The thin film transistor according to claim 1, wherein the thermal cross-linking agent includes at least one acetate compound of a metal, and the metal is one of aluminum, zirconium, titanium, magnesium, hafnium, and tin.

18. The thin film transistor according to claim 1, wherein the semiconductor is an organic semiconductor.

19. The thin film transistor according to claim 1,

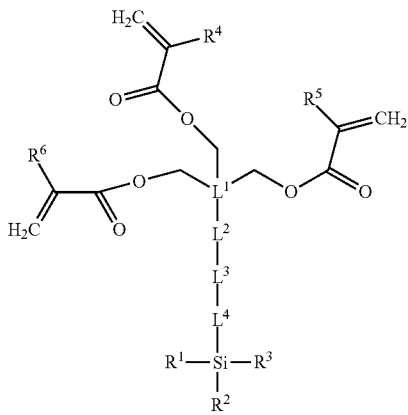

wherein the thermal cross-linking agent is selected from the group consisting of aluminum acetoacetate, zirconium acetoacetate, titanium acetoacetate, magnesium acetoacetate, hafnium acetoacetate, and tin acetoacetate.

20. A capacitor, comprising:
a first electrode;
a second electrode on the first electrode; and
an insulating layer between the first electrode and the second electrode,
wherein the insulating layer includes a cured material of a composition comprising a product of condensation reaction between a thermal cross-linking agent and a product of hydrolysis and condensation polymerization of a compound represented by Chemical Formula 1, Chemical Formula 1

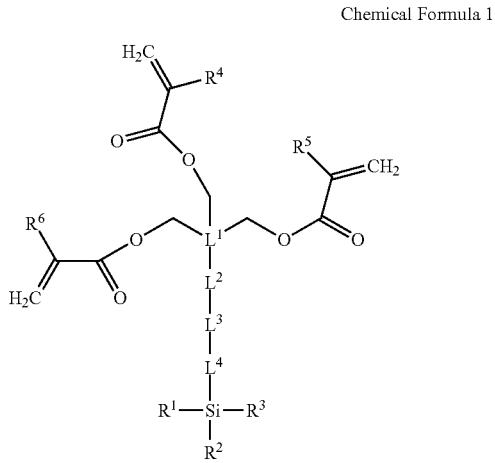

wherein, in the above Chemical Formula 1,
$R^1$, $R^2$, and $R^3$ are each independently one of hydrogen, a C1 to C20 alkoxy group, a hydroxyl group, a halogen, a carboxyl group, a substituted or unsubstituted C1 to C20 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkylnyl group, or a combination thereof, provided that at least one of $R^1$, $R^2$, and $R^3$ is one of a C1 to C20 alkoxy group, a hydroxyl group, a halogen, or a carboxyl group,
$R^4$ to $R^6$ are each independently hydrogen, or a C1 to C20 alkyl group,
$L^1$ is a carbon atom,
$L^2$ and $L^4$ are each independently one of a substituted or unsubstituted C1 to C20 alkylene group, a substituted or unsubstituted C6 to C20 arylene group, a substituted or unsubstituted C3 to C20 cycloalkylene group, a substituted or unsubstituted C2 to C20 alkenylene group, a substituted or unsubstituted C2 to C20 alkenylene group, —R—O—R'—, —R—NR'—, —R—(C=O)—R'— (wherein, R and R' are independently C1 to C10 hydrocarbon group), or a combination thereof, and
$L^3$ is one of —O—(C=O)—NR"—, —(C=O)—NR"— (wherein, R' is hydrogen, or a C1 to C6 hydrocarbon group), —O—, —COO—, or —S—.

21. The capacitor according to claim 20,

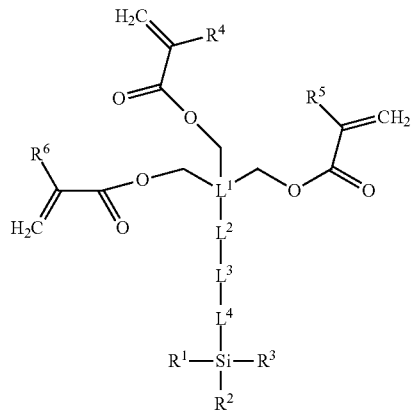

wherein the thermal cross-linking agent includes at least one of aluminum acetoacetate, zirconium acetoacetate, titanium acetoacetate, magnesium acetoacetate, hafnium acetoacetate, and tin acetoacetate.

* * * * *